United States Patent [19]
Yamaguchi

[11] Patent Number: 5,475,338
[45] Date of Patent: * Dec. 12, 1995

[54] ACTIVE FILTER CIRCUIT OF A CAPACITY GROUND TYPE

[75] Inventor: Futao Yamaguchi, Kanagawa, Japan

[73] Assignee: Sony Corporation, Tokyo, Japan

[ * ] Notice: The portion of the term of this patent subsequent to May 17, 2011, has been disclaimed.

[21] Appl. No.: 858,647

[22] Filed: Mar. 27, 1992

[30] Foreign Application Priority Data

Mar. 28, 1991 [JP] Japan ..................... 3-089881

[51] Int. Cl.$^6$ ............................ H03K 5/00; G06G 7/12
[52] U.S. Cl. .................... 327/552; 327/558; 327/560; 327/563; 327/310; 327/336
[58] Field of Search .................... 307/520, 494; 328/167, 165; 327/552, 558, 560, 563, 336, 309, 310, 314

[56] References Cited

U.S. PATENT DOCUMENTS

| | | | |
|---|---|---|---|
| 4,839,542 | 6/1989 | Robinson | 307/520 |
| 4,841,179 | 6/1989 | Hagino et al. | 307/520 |
| 4,851,718 | 7/1989 | Hagino et al. | 307/520 |
| 4,859,881 | 8/1989 | Yamamoto et al. | 307/520 |
| 4,922,139 | 5/1990 | Giebel | 328/167 |
| 4,926,135 | 5/1990 | Voorman | 330/107 |
| 5,051,628 | 9/1991 | Hanna | 307/520 |
| 5,053,639 | 10/1991 | Taylor | 307/359 |
| 5,134,318 | 7/1992 | Itoh | 328/167 |
| 5,192,884 | 3/1993 | Kusano | 307/520 |
| 5,206,548 | 4/1993 | Takahashi et al. | 328/165 |

Primary Examiner—Timothy P. Callahan
Assistant Examiner—Trong Phan
Attorney, Agent, or Firm—Hill, Steadman & Simpson

[57] ABSTRACT

An active filter circuit has differential transistors having first conductivity type bipolar transistors and load transistors having second conductivity type bipolar transistors. A connecting node between the differential transistors and the load transistors is driven by a middle electric potential. Voltage dependent characteristics of earth capacitance including parasitic capacitances parasitic to the differential transistors and the load transistors can be kept constant by offsetting the voltage dependent characteristics of the parasitic capacitances. It is thereby possible to make the active filter circuit small in size and the consumed electric power reduced.

4 Claims, 5 Drawing Sheets

| $V_R$ [V] | $C_{jP}$ [pF] | $C_{jN}$ [pF] | $C_T$ [pF] | NORMALI-ZATION |
|---|---|---|---|---|
| 2.0 | 0.5092 | 0.4350 | 0.9442 | 1.0094 |
| 2.5 | 0.4677 | 0.4677 | 0.9354 | 1.0000 |
| 3.0 | 0.4350 | 0.5092 | 0.9442 | 1.0094 |

ACTIVE FILTER CIRCUIT OF A CAPACITY GROUND TYPE

BACKGROUND OF THE INVENTION

This invention relates to an active filter circuit, and is suitable for an application particularly to a low-pass filter circuit.

A variety of filter circuits have hitherto been constructed by combinations of passive elements such as capacitors, resistances, etc. and active elements such as transistors, etc., because an inductor can not be mounted on an integrated circuit (IC).

Figure 1:
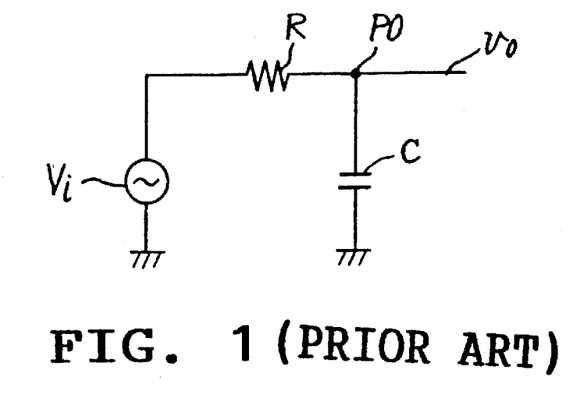
FIG. 1 is a wiring diagram illustrating a basic construction of a low-pass filter.

For instance, as illustrated in FIG. 1, one terminal of a capacitor C is connected to a connecting node P0 between a resistance R and an output terminal, while the other terminal thereof is grounded, thus constructing a primary low-pass filter.

By the way, a cut-off frequency f of this low-pass filter can be expressed by the following formula:

$$f = \frac{1}{2\pi CR} \text{ [Hz]} \tag{1}$$

There exist, however, scatters of approximately ±15–20 [%] and ±6–15 [%] in terms of accuracy in the IC. Further, the resistance R exhibits a temperature characteristic to have an amount of variation of approximately 3000 [ppm/°C.], i.e., nearly 30 [%] at 100 [°C.]. This causes a problem wherein the cut-off frequency is not constant.

Figure 2:
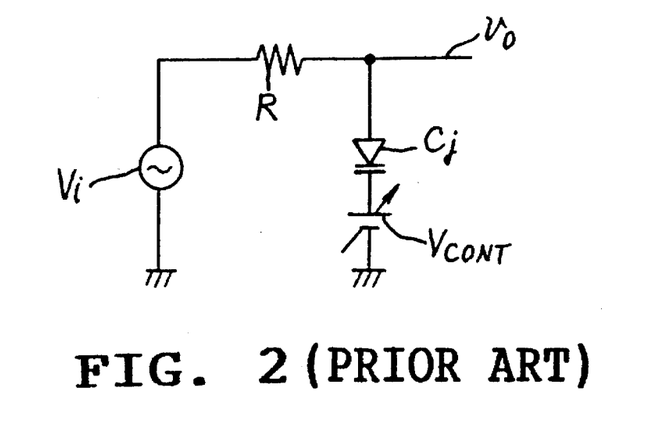
FIG. 2 is a wiring diagram explaining a capacitance variable type low-pass filter.
Figure 3:
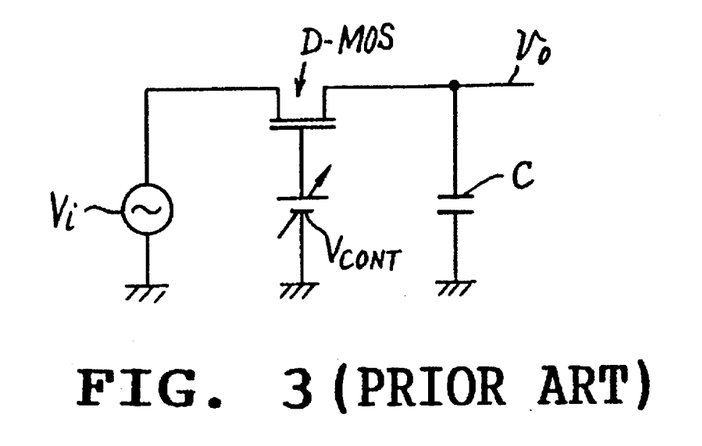
FIG. 3 is a wiring diagram explaining as resistance variable type low-pass filter.

Then, low-pass filters illustrated in FIGS. 2 and 3 have been proposed in order to make the cut-off frequency f constant irrespective of fluctuations in resistance value of the above-mentioned resistance R or in capacitance of the capacitor C.

Voltage-controlled, to be specific, are voltage characteristics (shown in FIG. 4) of a junction capacitance (hereinafter referred to as a voltage variable capacitance) composed of a diode or voltage characteristics (shown in FIG. 5) of a variable resistance value $R_j$ of a depletion type MOS transistor (hereinafter abbreviated to D-MOS (depletion metal oxide semiconductor)). A product C·R of the capacitance and the resistance value is made constant on the whole, whereby the cut-off frequency f becomes constant.

The D-MOS herein exhibits such a nature that a drain current $I_D$ flows simply by applying a drain-source voltage $V_D$ and reduces as a gate voltage $V_G$ increases in the negative direction.

Figure 4:
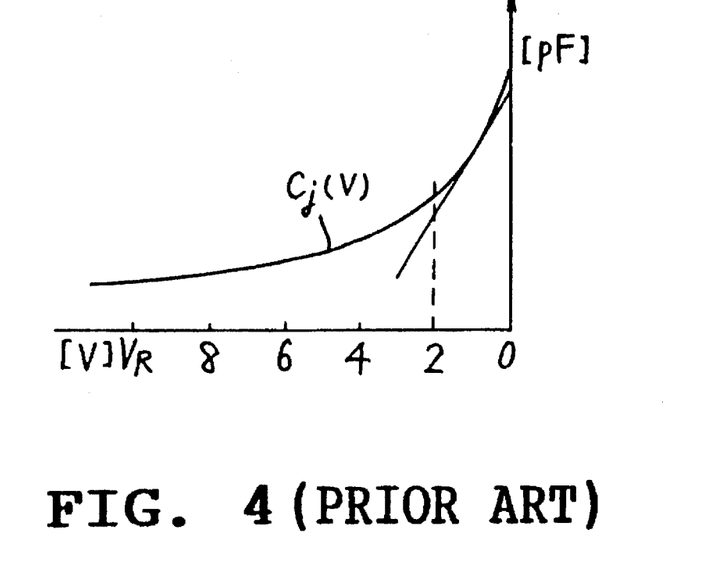
FIG. 4 is a characteristic curve view exhibiting the voltage dependent characteristics of a capacitance variable type low-pass filter.

As depicted in FIG. 2, the scatters caused in the resistance R and in the capacitance C are compensated by making the voltage variable capacitance $C_j$ variable in order to control the value C·R to a constant value. In this case, the voltage variable capacitance $C_j$ is required to be variable in a range of +20 [%] or greater. Hence, a region of 0–2 [V] which has the largest voltage dependency has to be used as an inter junction reverse bias voltage $V_R$ (>0) (FIG. 4).

In the case of making the voltage variable capacitance $C_j$ variable by using this region, however, because of utilizing a non-linear region, an input signal level is as small as 0.2 [Vp-p] in order that a distortion of the output signal falls within 1 [%].

Besides, the input signal level can not be set large, and hence there arises such a problem that a deterioration in signal-to-noise ratio (hereinafter referred to as an S/N ratio) is inevitable.

Figure 5:
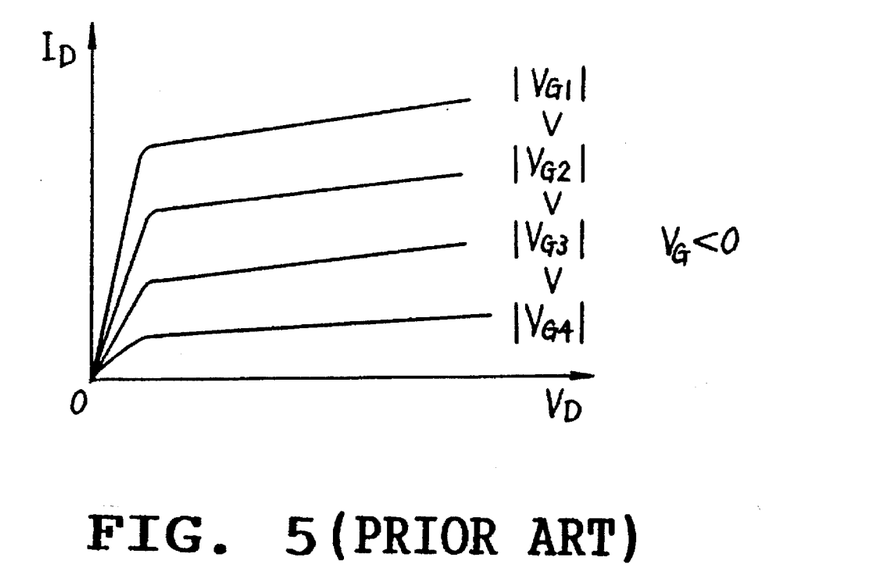
FIG. 5 is a characteristic curve view showing the voltage dependent characteristics of the resistance variable type low-pass filter.

On the other hand, as illustrated in FIG. 3, the scatters produced in the resistance R and in the capacitance C are compensated by making the variable resistance value $R_j$ variable to control the value of C·R to a constant value. In this case also, because of the necessity for largely varying the variable resistance value $R_j$, it is required that the non-linear region be utilized. This conduces to a problem wherein the input signal level can not be set large (FIG. 5).

For this purpose, a low-pass filter 1 (FIG. 6) employing a transconductance variable type differential amplifier circuit has been proposed so that the input signal level can be set large.

Figure 6:
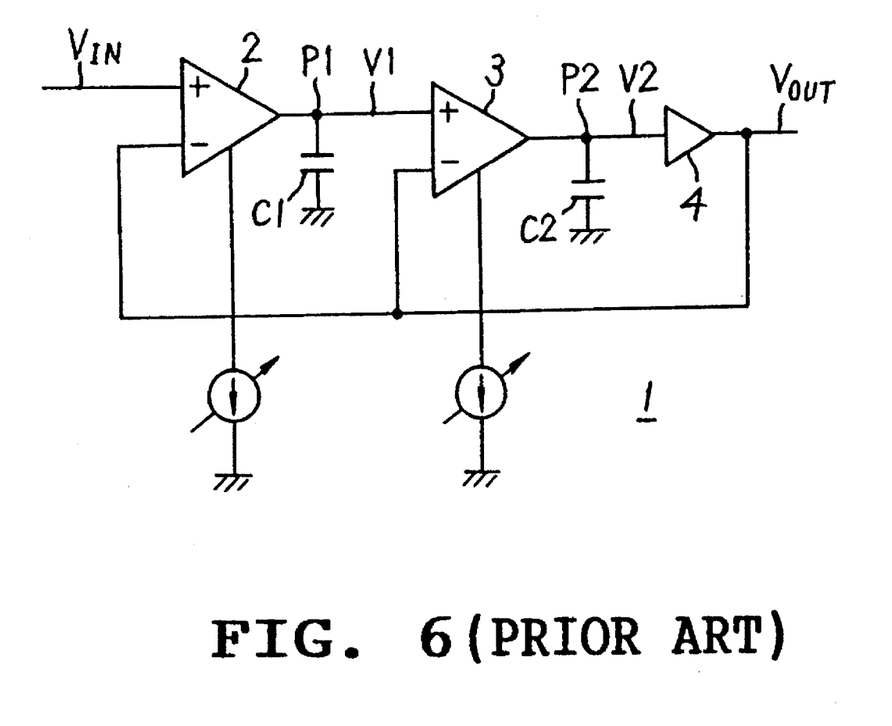
FIG. 6 is a block diagram depicting a construction of a conventional low-pass filter.

The low-pass filter 1 consisting of a 2-stage low-pass filter is constructed such that an input signal $V_{in}$ passes through first and second operational amplifiers 2 and 3 constituting a current mirror type differential amplifier circuit and is thereafter output as an output signal $V_{out}$ from a buffer 4.

A differential output V1 of the first operational amplifier 2 is herein input to a non-inverting input terminal of the second operational amplifier 3. A capacitor C1 is connected to a connecting node P1 between the output terminal of the amplifier circuit 2 and the non-inverting input terminal of the amplifier circuit 3.

A differential output V2 of the operational amplifier 3 is supplied to the buffer 4. At the same time, a capacitor C2 is connected to a connecting node P2 between the output terminal of the second operational amplifier 3 and the input terminal of the buffer 4.

The output signals $V_{out}$ are respectively fed back to inverting input terminals of the first and second operational amplifiers 2 and 3, thereby amplifying a difference in electric potentials between the input signal $V_{in}$ and the output signal $V_{out}$, and between the output signal V1 of the first operational amplifier 2 and the output signal $V_{out}$.

The capacitors C1 and C2 are herein defined as non-voltage-dependent capacitors composed of MIS (Metal Insulator Semiconductor) or MOS (Metal Oxide Semiconductor) capacitors so connected that the capacitances thereof do not fluctuate due to parasitic capacitances which fluctuate depending on the voltage while being parasitic to the first and second operational amplifiers 2 and 3. The capacitances are selected larger by one order than the parasitic capacitance (i.e., 10 [pF] for 1 [pF]).

However, for instance, a size of 100×100 [µm] is needed for taking large capacitances of the capacitors C1 and C2 formed in the IC. The IC itself has to increase in size for the transistor of 15×20 [µm].

Additionally, when using a built-in capacitance C and a transconductance $g_m$ expressed by the following formula:

$$g_m = \frac{1}{2(R + 2r_e)} \cdot \frac{I_x}{I} \tag{2}$$

The cut-off frequency f of the low-pass filter 1 is expressed by the following formula:

$$f = \frac{g_m}{2\pi C} \text{ [Hz]}$$

It is, however, required that the transconductance $g_m$ be increased in proportion to the capacitance C to keep constant a value of the cut-off frequency f. A current $I_x$ supplied to the operational amplifiers 2 and 3 has to be set large.

For this reason, in the case of the low-pass filter composed of the transconductance variable type differential amplifier circuit, a dynamic range of the input signals expands. On the other hand, the chip is enlarged because of increments in areas of the intra-IC capacitors C1 and C2. A problem is caused, wherein the consumed electric power supplied to the IC chip also augments.

SUMMARY OF THE INVENTION

In view of the foregoing, an object of this invention is to provide an active filter circuit which has a large band and a high S/N ratio and consumes a small amount of electric power with a simple construction.

The foregoing object and other objects of the invention have been achieved by the provision of an active filter circuit constructed of a transconductance variable type differential amplifier circuit, comprising: a load transistor Q8 and Q8A composed of a PNP type transistor and supplied with a first reference voltage $V_{cc}$ [V]; a differential input transistor Q4 and Q4A composed of an NPN type transistor and supplied with a second reference voltage 0 [V]; and a ground capacitance $C_T$ consisting of a first parasitic capacitance $C_{jp}$ parasitic between the load transistor and the first reference voltage and a second parasitic capacitance $C_{jn}$ parasitic between the differential input transistor Q4 and Q4A and the second reference voltage 0 [V], characterized in that a connecting node P10 and P11 between the load transistor Q8 and Q8A and the differential input transistor Q4 and Q4A to which the parasitic capacitances are parasitic is driven by a middle electric potential $V_{cc}/2$ [V] between the first and second reference voltages $V_{cc}$ [V] and 0 [V], and there is output a differential output signal V1 and V2 corresponding to a difference between an input signal $V_{in}$ and V2 or between V1 and V2 input to the differential input transistor from the connecting node P10 and P11.

Set to the middle electric potential $V_{cc}/2$ [V] between the first and second reference voltages $V_{cc}$ [V] and 0 [V] are operating points of the first and second parasitic capacitances $C_{jp}$ and $C_{jn}$ parasitic between the first and second reference voltages $V_{cc}$ [V] and 0 [V] and the connecting nodes P10 and P11 of the differential input transistors Q4 and Q4A and the load transistors Q8 and Q8A. The voltage dependent characteristics of the first and second parasitic capacitances $C_{jp}$ and $C_{jn}$ .pa are offset on the whole. It is, therefore, possible to obtain the active filter circuit which exhibits a large band, a high S/N ratio, consumes a small amount of electric power and provides a Still smaller chip size.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 7:
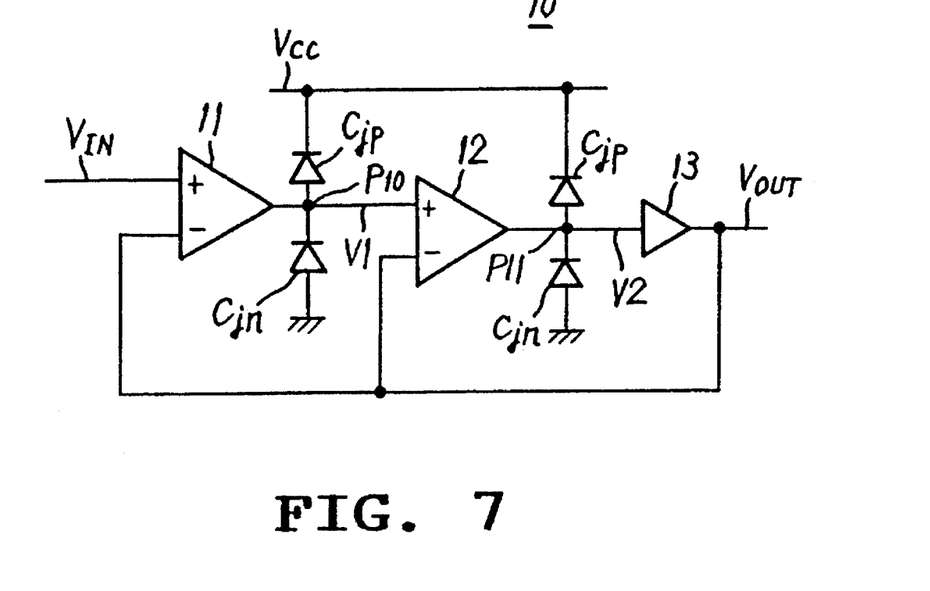
FIG. 7 is a block diagram showing one embodiment of a low-pass filter circuit according to the present invention.

Preferred embodiments of this invention will be described with reference to the accompanying drawings:

Referring to FIG. 7, a low-pass filter 10 classified as a transconductance variable type differential amplifier circuit is composed of 2-stage operational amplifiers 11, 12 and a buffer 13, this filter being adapted to output only input signals $V_{in}$ having a cut-off frequency f or under as output signals $V_{out}$.

The output signals $V_{out}$ from the buffer 13 consisting of a transistor are respectively fed back to inverting input terminals of the first and second operational amplifiers 11 and 12.

Connected herein to output terminals of the first and second operational amplifiers 11 and 12 are a connecting node P10 between the first and second operational amplifiers 11 and 12 and a connecting node P11 between the second operational amplifier 12 and the buffer 13. Parasitic capacitances $C_{jn}$ and $C_{jp}$ are electrically grounded and connected in parallel to the connecting nodes P10 and P11 between a power source voltage $V_{cc}$ and a ground electric potential.

The parasitic capacitances $C_{jn}$ and $C_{jp}$ are herein junction capacitances formed by PN junction from collectors of being diode-connected PNP and NPN transistors, the power source voltage $V_{cc}$ and the ground electric potential respectively applied and exhibit voltage dependent characteristics equal to each other.

Figure 8:
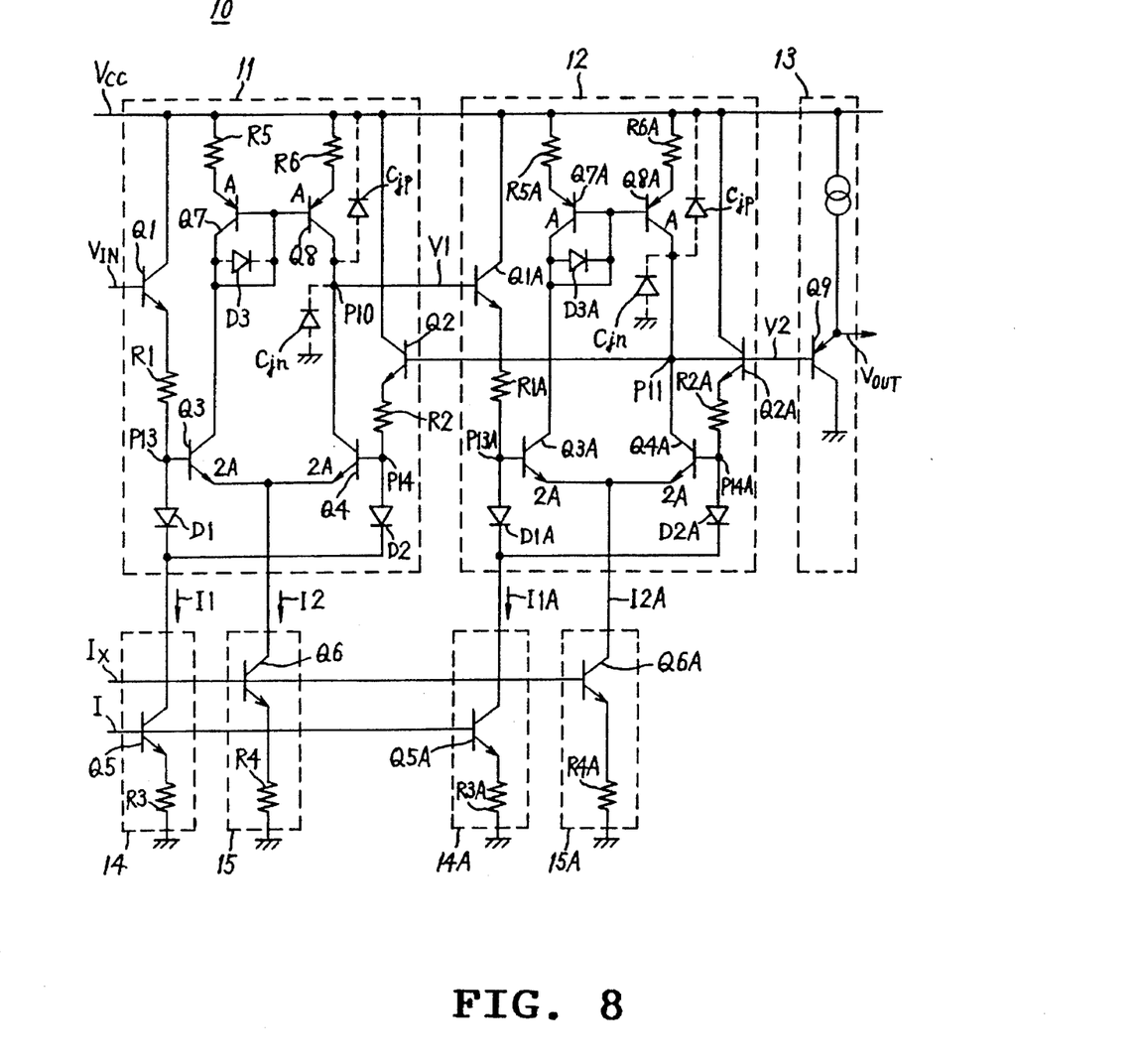
FIG. 8 is a wiring diagram illustrating a detailed construction of FIG. 7.

The low-pass filter 10 is, as illustrated in FIG. 8, constructed of a detailed circuit.

The operational amplifier 11 consists of a current mirror type differential amplifier circuit. Transistors Q1 and Q2 composed of the NPN type transistors are connected in parallel between the power source voltage $V_{cc}$ and the ground electric potential. Input signals $V_{in}$ and output signals V2 are supplied via the transistors Q1 and Q2 to differential input transistors Q3 and Q4 each composed of PNP type bipolar transistor.

Emitters of the transistors Q1 and Q2 are respectively connected to a common constant current source 14 through resistances R1 and R2 and diodes D1 and D2.

The constant current course 14 constructed of an NPN type transistor Q5 and a resistance R3 is adapted to control a constant current I1 flowing in the constant current source 14 with the aid of a reference current I.

Bases of the differential input NPN type transistors Q3 and Q4 are connected to a connecting node P13 between the resistance R1 and the diode D1 and to a connecting node P14 between the resistance R2 and the diode D2. The input signals $V_{in}$ and the output signals V2 are supplied to bases of the transistors Q3 and Q4.

Emitters of the transistors Q3 and Q4 are connected to each other and further to a collector of an NPN type transistor Q6 of the constant current source 15.

The emitter of the transistor Q6 is grounded via the resistance R4 so that a current I2 flowing in the differential amplifier circuit is controlled by the reference current input to the base thereof.

Respective collectors of the transistors Q3 and Q4 are connected to collectors of transistors Q7 and Q8 each consisting of an NPN type bipolar transistor and serving as an active load.

Respective emitters of the load transistors Q7 and Q8 are connected via the resistances R5 and R6 to the power source voltage $V_{cc}$. Bases thereof are mutually connected to a collector of the transistor Q7.

A diode D3 is thereby formed at a PN junction between the base and the collector of the load transistor Q7.

The operational amplifier 11 is constructed to supply output signals V1 to the next stage operational amplifier 12 from the connecting node P10 through which the collectors of the differential input transistor Q4 and of the load transistor Q8 are connected to each other.

In the case of this embodiment, the bases of the differential input transistors Q3 and Q4 are formed twice as large as base areas of the load transistors Q7 and Q8. The parasitic capacitances $C_{jn}$ and $C_{jp}$ exhibit the same voltage dependent characteristics, the capacitance $C_{jn}$ being produced at the PN junction between the substrate and the collector of the differential input transistor Q4, and the capacitance $C_{jp}$ being produced at the PN junction between the power source voltage and the collector of the load transistor Q8.

Namely, of the parasitic capacitances formed at the connecting node P10 (similarly P11 of amplifier 12 described below), the parasitic capacitance $C_{jp}$ formed between the power source voltage and the collector of the transistor Q8 is expressible by the following formula by use of a built-in voltage $\phi$ and a voltage dependent coefficient n (=1):

$$C_{jn} = C_{jo} \frac{k_1}{\sqrt{1 + V_R/\phi}} \tag{4}$$

The parasitic capacitance $C_{jn}$ formed between the earth electric potential and the collector of the transistor Q4 is expressible by the following formula:

$$C_{jp} = C_{jo} \frac{k_2}{\sqrt{1 + (V_{cc} - V_R)/\phi}} \tag{5}$$

It can be herein deemed that the parasitic capacitances $C_{jp}$ and $C_{jn}$ are electrically parallel-grounded. A total ground capacitance $C_T$ in terms of output of the amplifier circuit is obtained by the following formula:

$$C_T = C_{jo} \left( \frac{k_2}{\sqrt{1 + (V_{cc} - V_R)/\phi}} + \frac{k_1}{\sqrt{1 + V_R/\phi}} \right) \tag{6}$$

A size of the NPN type transistor Q4 is selected twice as large as the load transistor Q8 so that the coefficients $k_1$ and $k_2$ become a constant value k. Hence, the formula (6) is rearranged by the coefficient k and is expressible as the following formula:

$$C_T = C_{jo} k \left( \frac{1}{\sqrt{1 + (V_{cc} - V_R)/\phi}} + \frac{1}{\sqrt{1 + V_R/\phi}} \right) \tag{7}$$

Figure 9:
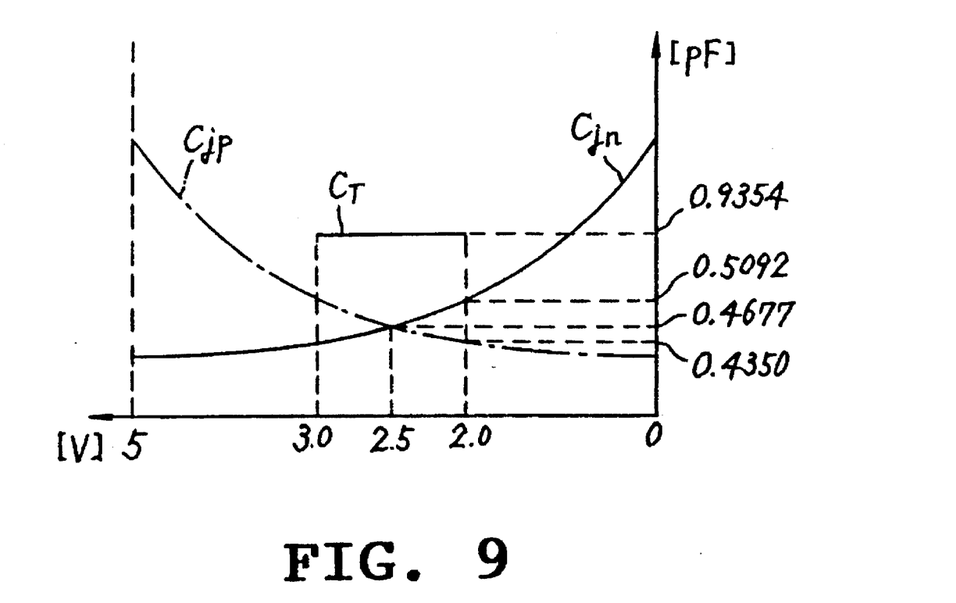
FIG. 9 is a characteristic curve view showing voltage dependent characteristics of parasitic capacitances.

In the case of this embodiment, the power source voltage $V_{cc}$ is set to 5 [V], and an operating point of the connecting node P10 (P11) is given by $V_{cc}/2$, i.e., set to 2.5 [V]. The total ground capacitance $C_T$ is thus obtained. As shown in FIG. 9, the voltage dependency of the ground capacitance $C_T$ can be substantially eliminated.

The operational amplifier 12 has the same construction as that of the operational amplifier 11. The parasitic capacitances $C_{jn}$ and $C_{jp}$ are respectively formed at the connecting node P11 between a load transistor Q8A and a differential input transistor Q4A.

The operational amplifier 12 receives the output signal V1 of the first stage operational amplifier 11 and supplies the output signals V2 to the bases of the transistor Q2 of the first stage operational amplifier 11 and the differential input transistor Q2A from the connecting node P11. Simultaneously, the amplifier 12 supplies the output signal V2 to a base of a buffer transistor Q9 consisting of a PNP type transistor. The output signal $V_{out}$ which has been 2-stage-amplified by the operational amplifiers 11 and 12 is output from an emitter of the transistor Q9.

Based on the construction described above, in the operational amplifier 11 (and 12), when the input signal $V_{in}$ assumes a constant electric potential, the input signals $V_{in}$ and the output signals V2 (output signals V1 and V2) each assuming the same electric potential are given to the differential input transistors Q4 (Q4A) and Q5 (Q5A), with the result that collector currents equal flow.

Figure 10:
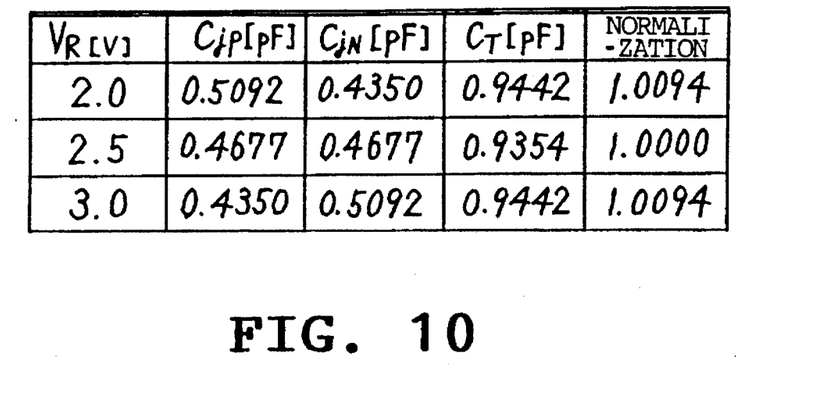
FIG. 10 is a table explaining the voltage dependent characteristics of a ground capacitance in an output stage.

At this time, as shown in FIG. 10, both of the parasitic capacitances $C_{jp}$ and $C_{jn}$ are 0.4677 [pF], where the built-in voltage $\phi$ is 0.7 [V], the capacitance coefficient $C_{jo}$ is 0.8 [pF], and the electric potential $V_R$ at the connecting node P10 is 2.5 [V]. The total ground capacitance $C_T$ of the operational amplifier 11 is 0.9354 [pF].

At this moment, the electric potential at the connecting node P10 (P11) is kept at 2.5 [V]. When the input signal $V_{in}$ increases by $\Delta V$ [V] in this state, a current driving capability of the transistor Q3 (Q3A) increases, and the current flowing in the load transistor Q7 (Q7A) also augments.

On the other hand, the current flowing in the load transistor Q8 (Q8A) decreases, as a result of which the electric potential at the connecting node P10 also increments. When the electric potential $V_R$ at the connecting node P10 (P11) becomes 3.0 [V] at this time, the parasitic capacitances $D_{jp}$ and $V_{jn}$ are 0.4350 [pF] and 0.5092 [pF], respectively. The total ground capacitance $C_T$ is 0.9442 [pF].

Whereas if the input signal $V_{in}$ decreases by $\Delta V$ [V], the current of the transistor Q3 (Q3A) is reduced, as a consequence of which the output of the connecting node P10 also decrements.

When the electric potential $V_R$ at the connecting node P10 (P11) comes to 2.0 [V] at this time, the parasitic capacitances $C_{jp}$ and $C_{jn}$ are 0.5092 [pF] and 0.4350 [pF], respectively. The total ground capacitance $C_T$ is 0.9442 [pF].

Thus, when performing normalization in which the total ground capacitance $C_T$ (0.9354 [pF]) at the central electric potential of 2.5 [V] is set to 1.0000, both fluctuation quantities in the total ground capacitance $C_T$ exhibit 1.0094 even in such a case that the electric potential $V_R$ at the connecting node P10 (P11) becomes 2.0 or 3.0 [V]. The fluctuation quantity in the total ground capacitance $C_T$ is stable within ±1 [%] even when an amplitude of the input signal fluctuates by 1 [V].

As a result of this, the voltage dependent characteristics of the ground capacitance $C_T$ connected to the output stage are kept constant. This eliminates the necessity for a MIS or MOS capacitor required for avoiding the influences caused when the parasitic capacitances $C_{jp}$ and $C_{jn}$ have hitherto fluctuated depending on the voltage.

The cut-off frequency f of the low-pass filter 10 is, as shown in the formula (3), obtained from the capacitance C and the transconductance $g_m$. However, the capacitance which has hitherto required approximately 10 [pF] can be reduced by a factor of 10, i.e., down to approximately 1 [pF]. When obtaining the same cut-off frequency f as the conventional one, the current I2 (I2A) flowing in the current source connected to the differential amplifier can be reduced by a factor of 10, thereby decreasing the current consumed in the low-pass filter on the whole.

Besides, reversely to this, when being used with the same consumed electric power as the conventional one, the capacitance of the denominator in the cut-off frequency f shown in the formula (3) is decreased by a factor of 10. Filter designing having a 10-fold band is thereby attainable.

Further, with respect to the output voltage V1 (V2) at the connecting node P10 (P11), the total ground capacitance $C_T$ is kept constant even when the amplitude of the input signal $V_{in}$ fluctuates by 1 [Vp-p], thereby making it possible to obtain the low-pass filter having no fluctuation in the cut-off frequency f and no distortion in the waveform.

As a consequence of this, the filter characteristics can be more improved by 20 [dB] than in the prior art.

Based on the construction described above, the NPN type transistor is employed as the load transistor Q8 (Q8A) of the differential amplification transistor Q2 (Q2A). The operating electric potential at the connecting node P10 between the differential amplification transistor Q2 (Q2A) and the load transistor Q8 (Q8A) is driven by a middle electric potential $V_{cc}/2$ of the power source voltage $V_{cc}$ (=5 [V]). It is, therefore, possible to substantially eliminate the voltage dependency of the synthetic capacitance $C_T$ of the parasitic capacitance $C_{jp}$ provided on the side of the power source and the parasitic capacitance $C_{jn}$ on the side of the ground.

It is thereby feasible to effectively avoid both the fluctuations in the cut-off frequency f due to the input signal level and a signal deterioration such as a distortion in the waveform.

In addition, the total ground capacitance can be reduced down to the parasitic capacitance (approximately 1 [pF]), i.e., 1/10 as small as the conventional one. Hence, much the same cut-off frequency f as the conventional one is obtainable by the current which is 1/10 as small as the conventional one. At the same time, where the electric power consumed is equalized substantially to that in the prior art, the wide band filter that is approximately tens times as wide as that in the prior art can be designed.

Further, it is possible to eliminate errors due to dust and pin holes on the wafer surface by using the parasitic capacitance formed in the direction vertical to the IC chip. The reliability on the low-pass filter can be further improved.

Unlike the prior art, no aluminum layer is formed on the capacitance C used for the low-pass filter, and it is, therefore, unnecessary to consider the deterioration in terms of characteristics due to the aluminum electrode.

Besides, there is no necessity for a built-in capacitance of the MOS capacitor which has hitherto been required for reducing the fluctuations in the total ground capacitance $C_T$ due to the voltage dependency of the parasitic capacitance. The IC can be thereby remarkably reduced in size.

The embodiment discussed above has dealt with the case of employing the parasitic capacitance $C_{jp}$ and $C_{jn}$ exhibiting 0.5 [pF] and formed on the sides of the power source and the ground and also the synthetic capacitance exhibiting 1 [pF]. The present invention is not, however, limited to these capacitances but may be applicable to a variety of capacitances.

The embodiment discussed above has dealt with the case of using the 2-stage low-pass filter. The present invention is not, however, limited to this low-pass filter but may be applied to an 1-stage low-pass filter and a multi-stage low-pass filter.

Further, the embodiment described above has dealt with the case where the power source voltage is 5 [V]. The present invention is not, however, limited to this voltage but may adopt such an arrangement that the connecting node P10 is, in short, driven by the node between the power source voltage and the ground electric potential.

Moreover, the embodiment discussed above has dealt with the case where the differential input transistor is formed to have the area which is twice as large as that of the load transistor. The differential input transistor may, however, be formed to have an n-fold area so as to equalize the parasitic capacitances parasitic to the collectors of the PNP type transistor and the NPN type transistor.

Additionally, the embodiment given above has dealt with the case where the present invention is applied to the low-pass filter. The present invention may, however, be applied to other filters, such as a high-pass filter, etc.

As discussed above, according to the present invention, the ground capacitance is connected to the connecting node between the differential input transistor and the load transistor, this ground capacitance being composed of the first parasitic capacitance parasitic between the differential input transistor and the first reference voltage and the second parasitic capacitance parasitic between the load transistor and the second reference voltage. This connecting node is driven by the middle electric potential between the first and second reference voltages. The voltage dependent characteristics of the ground capacitance is stabilized by offsetting the voltage dependent characteristics associated with the first and second parasitic capacitances, thereby making it possible to obtain the active filter circuit exhibiting a small amount of electric power consumed and a wide band.

While the present invention has been described in connection with the preferred embodiments of the invention, it will be obvious to those skilled in the art that various changes and modifications may be made therein without departing from the spirit and scope of the invention, and it is aimed, therefore, to cover in the appended claims all such changes and modifications as fall within the true spirit and scope of the invention.

What is claimed is:

1. An active filter circuit constructed of a transconductance variable type differential amplifier circuit, comprising:

load transistors consisting of first conductivity type transistor, said load transistors supplied with a first reference voltage;

differential input transistors consisting of second conductivity type bipolar transistors, said differential input transistors supplied with a second reference voltage;

a ground capacitance consisting of a first parasitic capacitance parasitic between said load transistors and said first reference voltage and a second parasitic capacitance parasitic between said differential input transistors and said second reference voltage;

wherein a connecting node between said first conductivity type transistor and said second conductivity type transistor to which said parasitic capacitances are parasitic is driven by a voltage equal to one-half the sum of said first and second reference voltages, and a differential output signal is output corresponding to a difference of input signals input to said differential input transistors from said connecting node.

2. The active filter circuit according to claim 1, wherein said first conductivity type transistor has a size which is a predetermined number of times as large as said second conductivity type transistor, thereby voltage dependent characteristics of said first parasitic capacitance are offset by voltage dependent characteristics of said second parasitic capacitance, and the voltage dependent characteristics of said ground capacitance are thus made constant.

3. The active filter circuit of claim 1 wherein said differential input transistors, said load transistors and said ground capacitance are operatively connected to form a corresponding operational amplifier stage.

4. The active filter circuit according to claim 1 wherein each of said differential input transistors is connected to a corresponding load transistor so as to equalize the parasitic capacitances parasitic to the first and second conductivity type transistors.

* * * * *